(12) United States Patent
Mauritzson

(10) Patent No.: US 7,701,493 B2
(45) Date of Patent: Apr. 20, 2010

(54) IMAGER ROW-WISE NOISE CORRECTION

(75) Inventor: Rick Mauritzson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1040 days.

(21) Appl. No.: 11/066,781

(22) Filed: Feb. 28, 2005

(65) Prior Publication Data

US 2006/0192864 A1 Aug. 31, 2006

(51) Int. Cl.
*H04N 5/217* (2006.01)
*H04N 9/64* (2006.01)

(52) U.S. Cl. ........................ 348/241; 348/243

(58) Field of Classification Search .......... 348/241–251
See application file for complete search history.

(56) References Cited

U.S. PATENT DOCUMENTS

| | | | |
|---|---|---|---|
| 5,471,515 A | 11/1995 | Fossum et al. | |
| 5,625,210 A * | 4/1997 | Lee et al. | 257/292 |
| 5,841,159 A * | 11/1998 | Lee et al. | 257/291 |
| 5,903,021 A * | 5/1999 | Lee et al. | 257/292 |
| 6,051,447 A * | 4/2000 | Lee et al. | 438/48 |
| 6,100,551 A * | 8/2000 | Lee et al. | 257/232 |
| 6,140,630 A | 10/2000 | Rhodes | |
| 6,204,524 B1 | 3/2001 | Rhodes | |
| 6,310,366 B1 | 10/2001 | Rhodes et al. | |
| 6,320,617 B1 * | 11/2001 | Gee et al. | 348/302 |
| 6,326,652 B1 | 12/2001 | Rhodes | |
| 6,333,205 B1 | 12/2001 | Rhodes | |
| 6,376,868 B1 | 4/2002 | Rhodes | |
| 6,388,243 B1 * | 5/2002 | Berezin et al. | 250/208.1 |
| 6,473,124 B1 | 10/2002 | Panicacci et al. | |
| 6,529,242 B1 | 3/2003 | Panicacci | |
| 6,566,697 B1 * | 5/2003 | Fox et al. | 257/292 |
| 6,781,169 B2 * | 8/2004 | Roy | 257/292 |
| 6,781,171 B2 * | 8/2004 | Jang et al. | 257/292 |
| 7,245,322 B2 * | 7/2007 | Oda et al. | 348/243 |
| 2001/0052574 A1 * | 12/2001 | Kurosawa et al. | 250/423 P |
| 2003/0052982 A1 | 3/2003 | Chieh | |
| 2004/0263641 A1 * | 12/2004 | Tsuda | 348/222.1 |
| 2005/0243194 A1 * | 11/2005 | Xu | 348/241 |
| 2006/0038207 A1 * | 2/2006 | Hong et al. | 257/292 |

\* cited by examiner

*Primary Examiner*—Tuan Ho
*Assistant Examiner*—Christopher K Peterson
(74) *Attorney, Agent, or Firm*—Dickstein Shapiro LLP

(57) ABSTRACT

An imager having optically and electrically black reference pixels in each row of the imager's pixel array. Since the reference pixels of each row experience the same row-wise noise as active imaging pixels in the associated row, the signals from the reference pixels are used to cancel out row-wise noise from the row of imaging pixels. The reference pixels are designed such that their photosensors are physically or effectively removed from the row-wise noise correction, thus rendering them electrically black or dark. As such, the reference pixels can be used to provide row-wise noise correction without the adverse effects of warm and hot pixels.

26 Claims, 10 Drawing Sheets

IMAGER ROW-WISE NOISE CORRECTION

FIELD OF THE INVENTION

The invention relates generally to imaging devices and more particularly to improved row-wise noise correction in an imaging device.

BACKGROUND

A CMOS imager circuit includes a focal plane array of pixel cells, each one of the cells including a photosensor, for example, a photogate, photoconductor or a photodiode for accumulating photo-generated charge in a portion of the substrate. Each pixel cell has a readout circuit that includes at least an output field effect transistor formed in the substrate and a charge storage region formed on the substrate connected to the gate of an output transistor. The charge storage region may be constructed as a floating diffusion region. Each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state before the transfer of charge to it; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

CMOS imagers of the type discussed above are generally known as discussed, for example, in U.S. Pat. No. 6,140,630, U.S. Pat. No. 6,376,868, U.S. Pat. No. 6,310,366, U.S. Pat. No. 6,326,652, U.S. Pat. No. 6,204,524 and U.S. Pat. No. 6,333,205, assigned to Micron Technology, Inc., which are hereby incorporated by reference in their entirety.

FIG. 1 illustrates a portion of a conventional CMOS imager 10. The illustrated imager 10 includes a pixel 20, one of many that are in a pixel array (not shown), connected to a column sample and hold circuit 40 by a pixel output line 32. The imager 10 also includes a readout programmable gain amplifier (PGA) 70 and an analog-to-digital converter (ADC) 80.

The illustrated pixel 20 includes a photosensor 22 (e.g., a pinned photodiode, photogate, etc.), transfer transistor 24, floating diffusion region FD, reset transistor 26, source follower transistor 28 and row select transistor 30. FIG. 1 also illustrates parasitic capacitance Cp1 associated with the floating diffusion region FD and the pixel's 20 substrate. The photosensor 22 is connected to the floating diffusion region FD by the transfer transistor 24 when the transfer transistor 24 is activated by a transfer control signal TX. The reset transistor 26 is connected between the floating diffusion region FD and an array pixel supply voltage Vaa-pix. A reset control signal RST is used to activate the reset transistor 26, which resets the floating diffusion region FD (as is known in the art).

The source follower transistor 28 has its gate connected to the floating diffusion region FD and is connected between the array pixel supply voltage Vaa-pix and the row select transistor 30. The source follower transistor 28 converts the stored charge at the floating diffusion region FD into an electrical output voltage signal. The row select transistor 30 is controllable by a row select signal SELECT for selectively connecting the source follower transistor 28 and its output voltage signal to the pixel output line 32.

The column sample and hold circuit 40 includes a bias transistor 56, controlled by a control voltage Vln_bias, that is used to bias the pixel output line 32. The pixel output line 32 is also connected to a first capacitor 44 thru a sample and hold reset signal switch 42. The sample and hold reset signal switch 42 is controlled by the sample and hold reset control signal SAMPLE_RESET. The pixel output line 32 is also connected to a second capacitor 54 thru a sample and hold pixel signal switch 52. The sample and hold pixel signal switch 52 is controlled by the sample and hold pixel control signal SAMPLE_SIGNAL. The switches 42, 52 are typically MOSFET transistors.

A second terminal of the first capacitor 44 is connected to the amplifier 70 via a first column select switch 50, which is controlled by a column select signal COLUMN_SELECT. The second terminal of the first capacitor 44 is also connected to a clamping voltage VCL via a first clamping switch 46. Similarly, the second terminal of the second capacitor 54 is connected to the amplifier 70 by a second column select switch 60, which is controlled by the column select signal COLUMN_SELECT. The second terminal of the second capacitor 54 is also connected to the clamping voltage VCL by a second clamping switch 48.

The clamping switches 46, 48 are controlled by a clamping control signal CLAMP. As is known in the art, the clamping voltage VCL is used to place a charge on the two capacitors 44, 54 when it is desired to store the reset and pixel signals, respectively (when the appropriate sample and hold control signals SAMPLE_RESET, SAMPLE_SIGNAL are also generated).

Referring to FIGS. 1 and 2, in operation, the row select signal SELECT is driven high, which activates the row select transistor 30. When activated, the row select transistor 30 connects the source follower transistor 28 to the pixel output line 32. The clamping control signal CLAMP is then driven high to activate the clamping switches 46, 48, allowing the clamping voltage VCL to be applied to the second terminal of the sample and hold capacitors 44, 54. The reset signal RST is then pulsed to activate the reset transistor 26, which resets the floating diffusion region FD. The signal on the floating diffusion region FD is then sampled when the sample and hold reset control signal SAMPLE_RESET is pulsed. At this point, the first capacitor 44 stores the pixel reset signal $V_{rst}$.

Immediately afterwards, the transfer transistor control signal TX is pulsed, causing charge from the photosensor 22 to be transferred to the floating diffusion region FD. The signal on the floating diffusion region FD is sampled when the sample and hold pixel control signal SAMPLE_SIGNAL is pulsed. At this point, the second capacitor 54 stores a pixel image signal $V_{sig}$. A differential signal ($V_{rst}$-$V_{sig}$) is produced by the differential amplifier 70. The differential signal is digitized by the analog-to-digital converter 80. The analog-to-digital converter 80 supplies the digitized pixel signals to an image processor (not shown), which forms a digital image output.

As can be seen from FIG. 1, most of the pixel readout circuitry is designed to be fully differential to suppress noise (substrate or power supply noise), which could create undesirable image artifacts (e.g., flickering pixels, grainy still images). The readout circuitry for the illustrated four transistor ("4T") pixel, and known three transistor ("3T") pixels, however, is single ended. During the sampling of the reset or pixel signal levels (described above), any noise on the substrate ground or clamp voltage is inadvertently stored on the sampling capacitors 44, 54. FIG. 3 illustrates portions of the imager 10 that are subject to substrate noise (e.g., at the floating diffusion region FD in the pixel 20 (arrow A) and the bias transistor 56 in the sample and hold circuitry 40 (arrow B)) and noise on the clamp voltage VCL (e.g., at clamping switches 46, 48 (arrow C)).

Because the sampling of the reset and pixel signal levels occur at different times, the random noise will be different between the two samples. Some components of the noise, however, are common to all the pixels in a particular row (e.g., substrate noise that is picked up by the floating diffusion region FD and the clamp voltage noise). When the entire row of pixels is sampled, the noise appears as horizontal lines in the image that are superimposed on top of the actual image. This common noise is referred to as "row-wise noise" because the noise for the entire row is correlated.

There is a desire and need to mitigate the presence of row-wise noise in acquired images.

SUMMARY

The invention provides an imager that mitigates the presence of row-wise noise in acquired images.

The invention provides an imager that mitigates the presence of row-wise noise in acquired images while also overcoming adverse effects attributable to warm and hot pixels.

Various exemplary embodiments of the invention provide an imager having optically and electrically black reference pixels in each row of the imager's pixel array. Since the reference pixels of each row experience the same row-wise noise as active imaging pixels in the associated row, the signals from the reference pixels are used to cancel out row-wise noise from the row of imaging pixels. The reference pixels are designed such that their photosensors are physically or effectively removed from the row-wise noise correction, thus rendering them electrically black or dark. As such, the reference pixels can be used to provide row-wise noise correction without the adverse effects of warm and hot pixels.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

Figure 1:
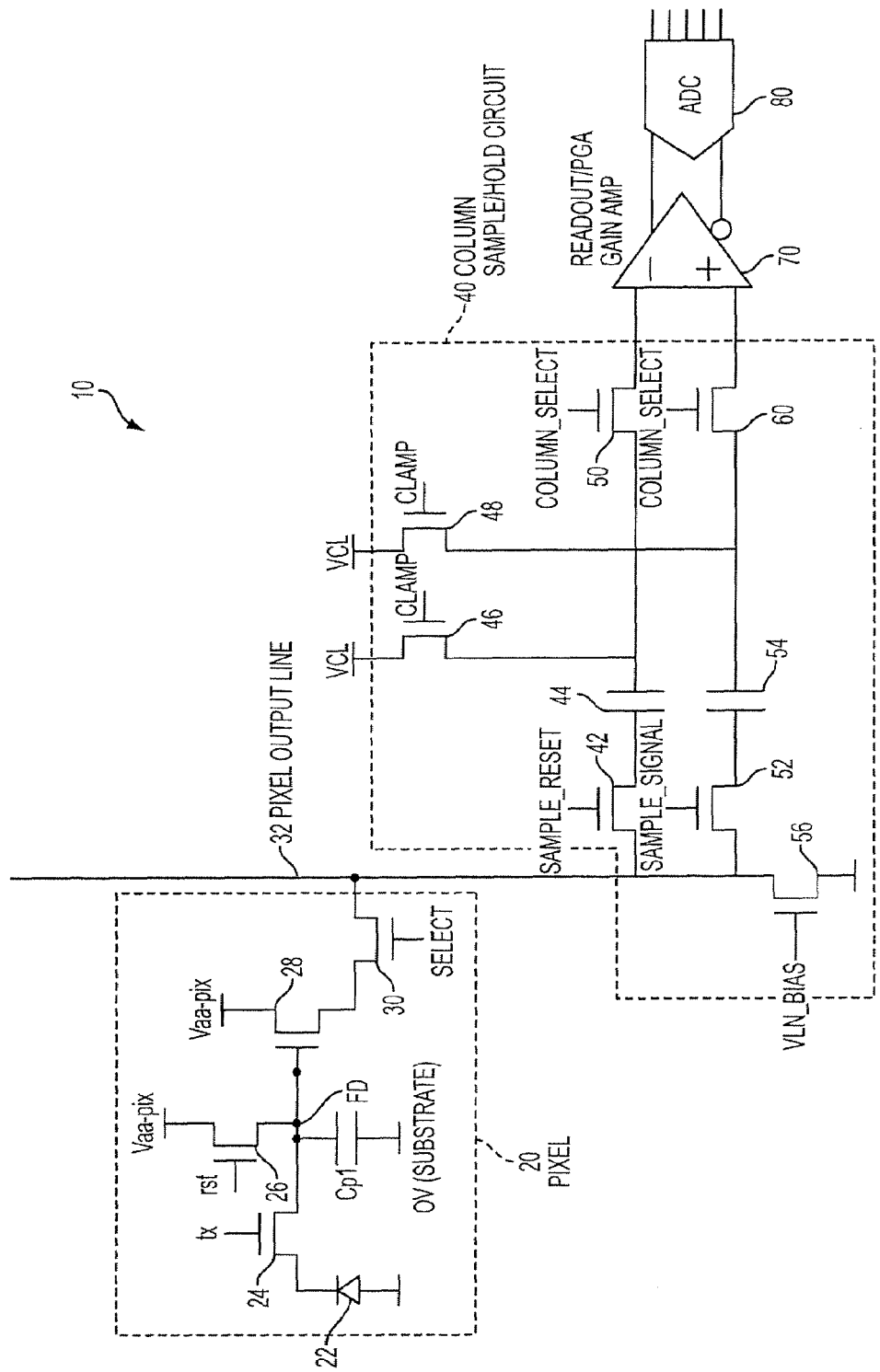
FIG. 1 is a diagram of a portion of a typical CMOS imager.
Figure 2:
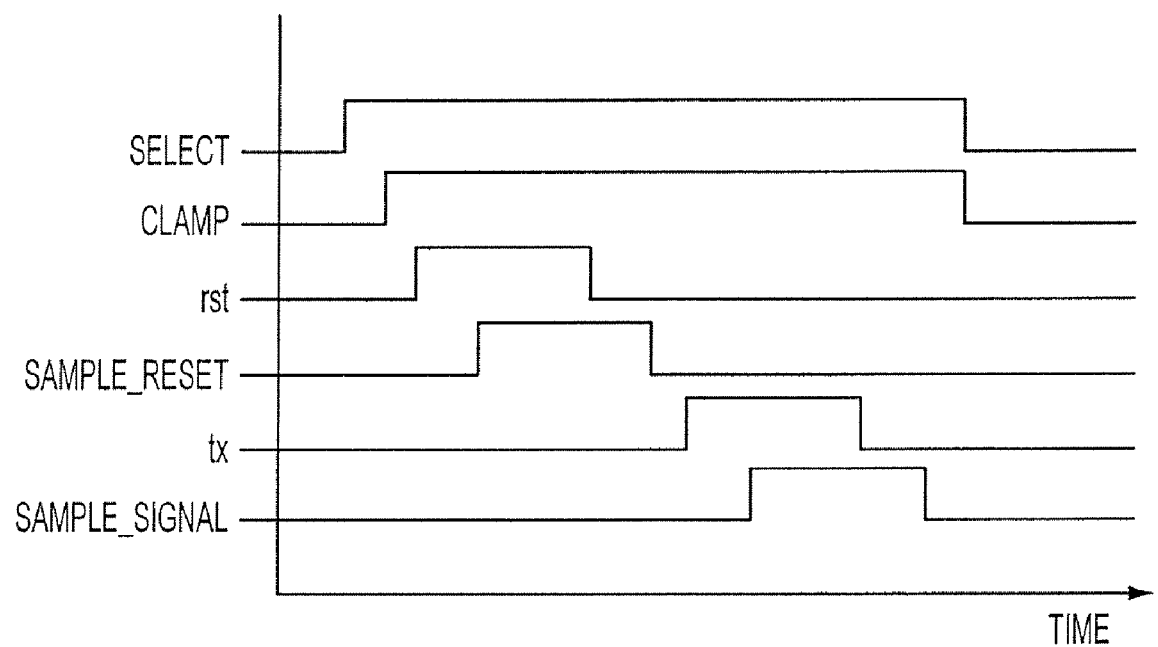
FIG. 2 is a timing diagram of the operation of the FIG. 1 imager.
Figure 3:
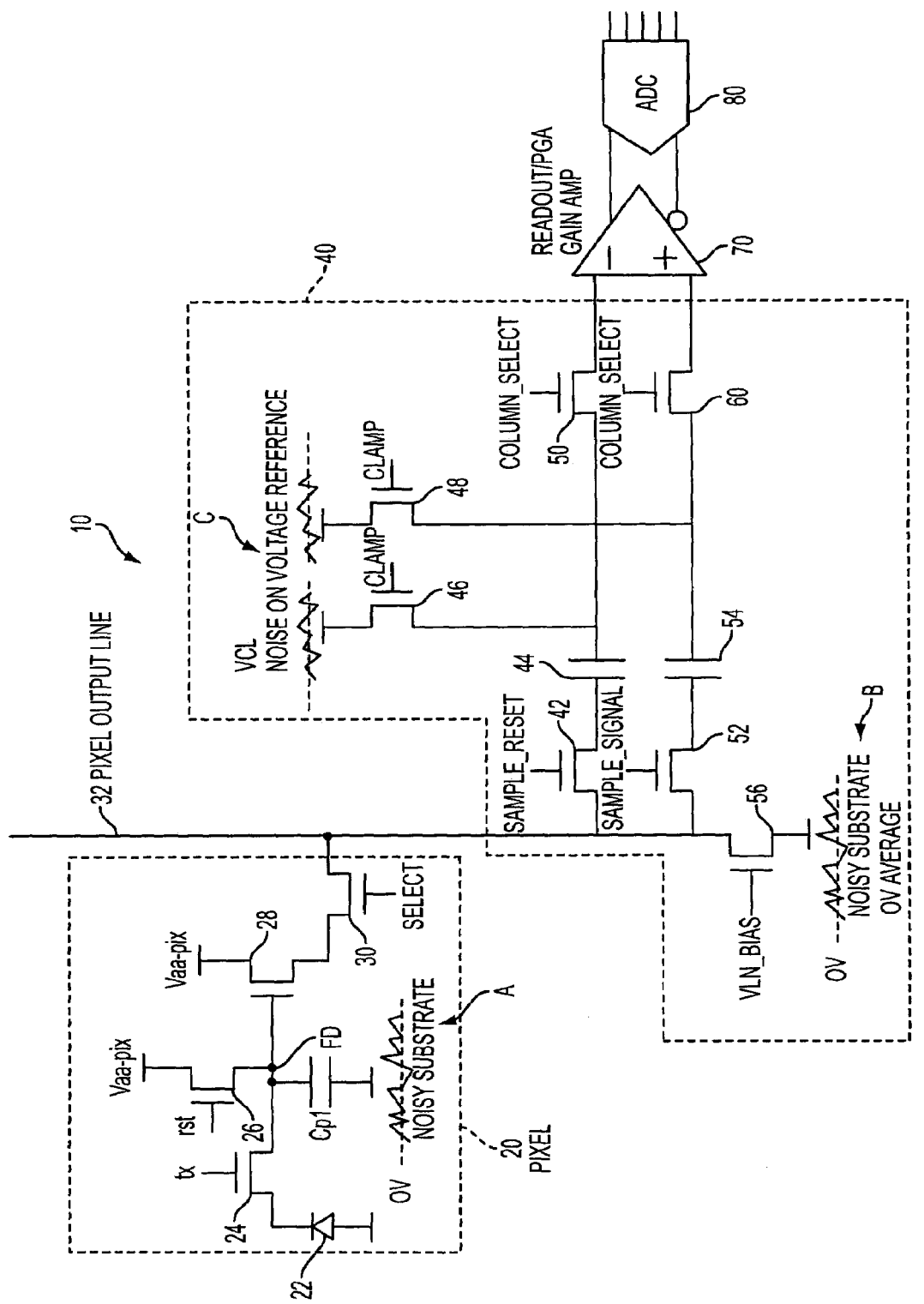
FIG. 3 is a diagram illustrating noise sources in the FIG. 1 imager.
Figure 4:
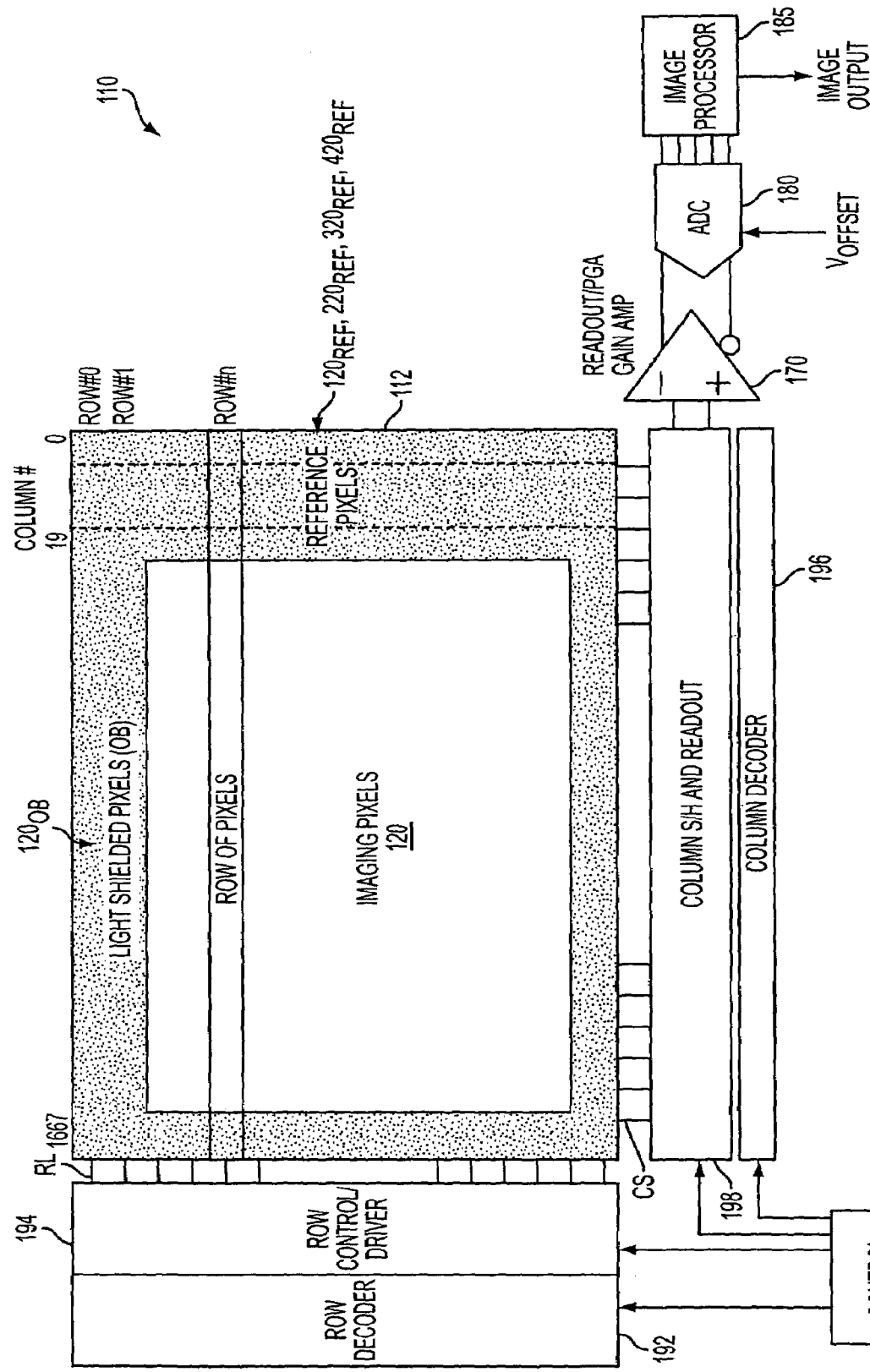
FIG. 4 is a diagram of a portion of a CMOS imager having row-wise noise correction.

Referring to the figures, where like reference numbers designate like elements, FIG. 4 shows of a portion of a CMOS imager 110 described in application Ser. No. 10/834,844, filed Apr. 30, 2004, which is hereby incorporated by reference in its entirety. The imager 110 includes a pixel array 112 comprised of active imaging pixels 120. The top portion of the array 112 contains light shielded optically black ("OB") pixels $120_{OB}$. In addition, the array 112 contains reference pixels $120_{REF}$, which are light shielded optically black pixels, associated with each row of active pixels 120. The OB and reference pixels $120_{OB}$, $120_{REF}$ are discussed below in more detail. According to application Ser. No. 10/834,844, the imaging, OB and reference pixels 120, $120_{OB}$, $120_{REF}$ may each have the construction of the 4T pixel illustrated in FIG. 1, or other types of pixel architectures suitable for use in a CMOS imager (e.g., 3T, 5T, etc.).

The illustrated imager 110 also contains a control circuit 190, row decoder 192, row controller/driver 194, column S/H and readout circuitry 198, a column decoder 196, readout/PGA gain amplifier 170, analog-to-digital converter 180 and an image processor 185. Row lines RL connected to the pixels 120, $120_{OB}$, $120_{REF}$ of the array 112 are selectively activated by the row driver 194 in response to the row address decoder 192. Column select lines CS are selectively activated by the column S/H and readout circuit 198 in response to the column address decoder 196. Pixel output lines for each column in the array are also connected to the column S/H and readout circuitry 198, but are not shown in FIG. 4.

The CMOS imager 110 is operated by the control circuit 190, which controls the decoders 192, 196 for selecting the appropriate row and column lines for pixel readout. The control circuit 190 also controls the row control/driver and column S/H and readout circuitry 192, 198, which apply driving voltages to the drive transistors of the selected row and column lines. The control circuit 190 also controls other signals (e.g., SAMPLE_RESET and SAMPLE_SIGNAL illustrated in FIG. 1) needed by the column S/H and readout circuitry 198 to readout, sample, hold and output reset and pixel signals.

The sample and hold portion of the column S/H and readout circuitry 198 reads a pixel reset signal $V_{rst}$ and a pixel image signal $V_{sig}$ for selected pixels. A differential signal ($V_{rst}$-$V_{sig}$) is produced by differential amplifier 170 for each pixel and is digitized by analog-to-digital converter 180. The analog-to-digital converter 180 supplies the digitized pixel signals to the image processor 185, which forms a digital image output.

The OB pixels $120_{OB}$ located at the top of the pixel array 112 are light shielded and comprise multiple rows and columns of optically black pixels. It is desirable that each column of the array 112 be connected to multiple rows of OB pixels $120_{OB}$. The OB pixels $120_{OB}$ are used for calibration purposes to compute a dark level pedestal, which is used as a minimum black signal reference point during calibration. An average of the signal levels of the OB pixels $120_{OB}$ is used to set an analog pedestal level to a target range.

The reference pixels $120_{REF}$ are also light shielded. One technique for shielding the reference pixels $120_{REF}$ is to cover them with metal. Because the reference pixels $120_{REF}$ are light shielded, the only signal that should be read from them should be dark or optically black signals. The reference pixels $120_{REF}$, however, experience the same row-wise noise superimposed on their signals that is experienced by the active pixels 120 within the same row. Thus, the row-wise noise for each row in the array 112 can be determined from the corresponding reference pixels $120_{REF}$. Each row's associated row-wise noise can therefore be removed from the signals output by its associated active pixels 120. A detailed explanation of how the reference pixels $120_{REF}$ are used to mitigate row-wise noise is found in application Ser. No. 10/834,844.

The above solution to row-wise noise may be adversely effected by what is known as "warm" or "hot" pixels. A warm pixel is a pixel that appears a little brighter than dark when it is supposed to be completely dark or optically black. Similarly, a hot pixel is a pixel that appears bright when it is supposed to be completely dark/black. Warm and hot pixels are typically caused by process defects such as e.g., silicon defects, metallic contamination, stress, etc. When one or more of the reference pixels $120_{REF}$ contain warm or hot pixels, the row-noise correction scheme can introduce a correction offset that is not attributable to the row-wise noise. That is, the values of the warm and hot reference pixels $120_{REF}$ throws off the row-wise noise compensation average discussed above; this improper average will cause an incorrect compensation/offset to be applied to the image pixels 120 in that row, causing the entire row of image pixels 120 to fail.

Figure 5:
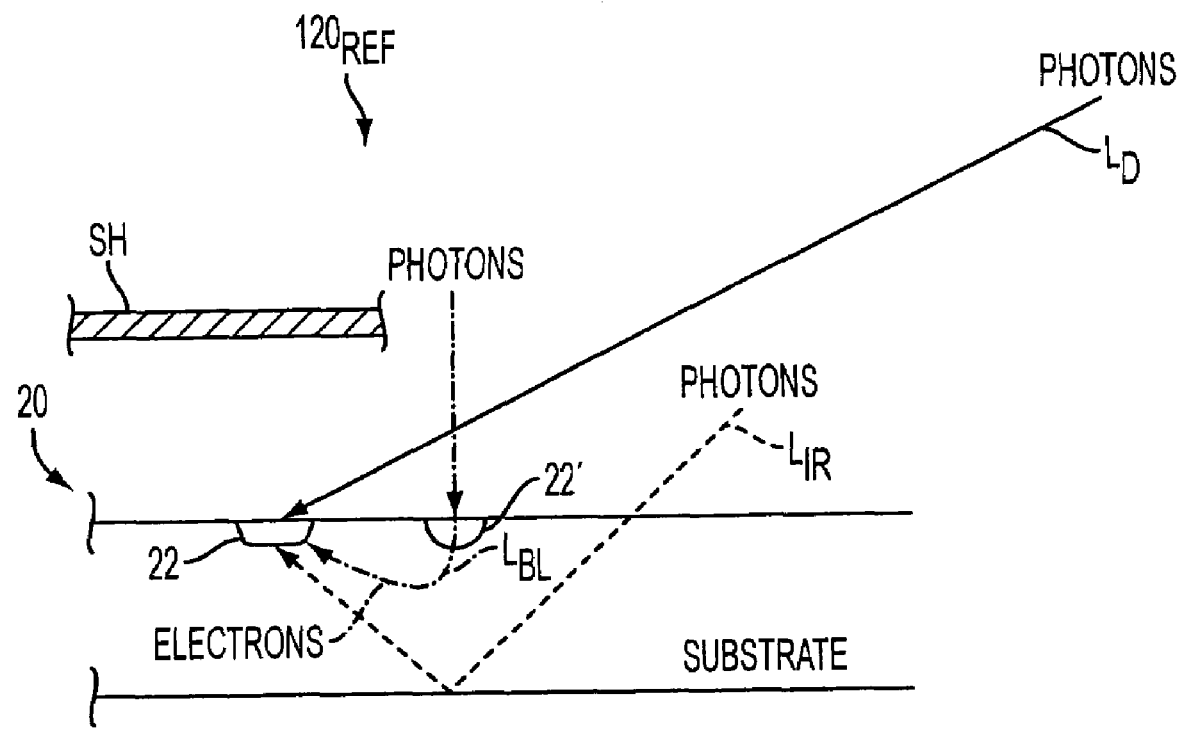
FIG. 5 illustrates possible causes of warm and hot pixels in a reference pixel used in the FIG. 4 imager.

Similar row failure problems can occur by other phenomena not related to process defects as is illustrated in FIG. 5. FIG. 5 illustrates an example of a pixel 20 that could be used as a reference pixel $120_{REF}$ by covering its photosensor 22 with a metallic or other opaque shield SH. As shown in FIG. 5, it is possible that light LD can get underneath the shield SH and strike the photosensor 22 directly, causing unwanted photons to reach the photosensor 22. Another undesirable phenomenon occurs when infrared light $L_{IR}$ travels through the pixel's substrate, is reflected from the bottom of the substrate and strikes the photosensor 22. Another undesirable phenomenon, known as blooming $L_{BL}$, occurs when stray electrons travel to the photosensor 22 from an adjacent pixel's photosensor 22' that may or may not be exposed to light. All of these phenomena cause photons and/or electrons to reach the photosensor 22 of the reference pixel $120_{REF}$, which is supposed to be electrically and/or optically black. These non-black reference pixels $120_{REF}$ will cause the row of imaging pixels 120 to fail when row-wise noise correction is applied to them (as described above).

The present invention provides a method and reference pixel structures for providing row-wise noise correction that will not suffer from warm and/or hot pixel phenomena and mitigates against the row failures attributable to warm and hot reference pixels. As a principle of the invention, the inventors have determined that row-wise noise is potentially caused by noise in the readout circuitry, row drivers or correlated double sampling process, but is not directly related to the photosensor. As such, the photosensor, which is the main source of warm and hot pixels, is effectively (and sometimes physically) removed from the row-wise noise correction scheme of the invention as is described below in more detail.

Figure 6:
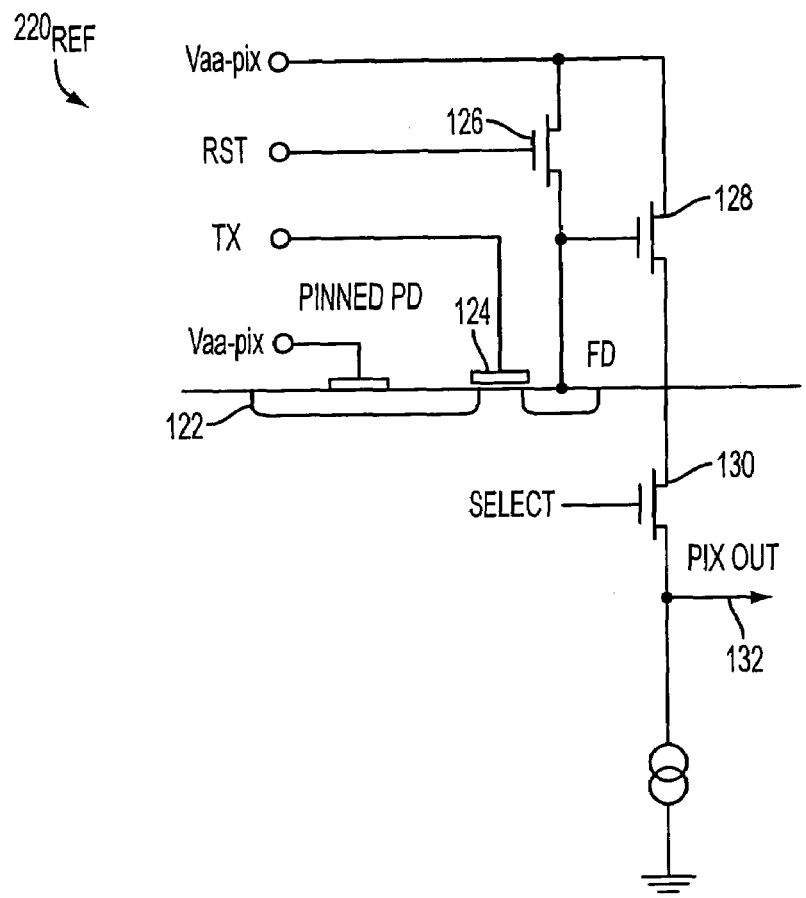
FIG. 6 illustrates an exemplary reference pixel, used in the FIG. 4 imager, constructed in accordance with an exemplary embodiment of the invention.

FIG. 6 illustrates a reference pixel $220_{REF}$ constructed in accordance with a first exemplary embodiment of the invention. A plurality of the illustrated reference pixels $220_{REF}$ replace the plurality of reference pixels $120_{REF}$ in the imager 110 illustrated in FIG. 4. The reference pixels $220_{REF}$ are covered by a light shield and are positioned on the periphery of the array of imaging pixels 120. Each reference pixel $220_{REF}$ of the illustrated embodiment includes a photosensor 122 (illustrated as a pinned photodiode), transfer transistor 124, floating diffusion region FD, reset transistor 126, source follower transistor 128 and a row select transistor 130.

The reference pixel $220_{REF}$ is essentially the same as the pixel 20 (FIG. 1), which is covered by a light shield to form the reference pixel $120_{REF}$ (FIG. 4). Thus, in operation, the photosensor 122 is connected to the floating diffusion region FD by the transfer transistor 124 when the transfer transistor 124 is activated by a transfer control signal TX. The reset transistor 126 is connected between the floating diffusion region FD and an array pixel supply voltage Vaa-pix. A reset control signal RST is used to activate the reset transistor 126, which resets the floating diffusion region FD. The source follower transistor 128 has its gate connected to the floating diffusion region FD and is connected between the array pixel supply voltage Vaa-pix and the row select transistor 130. The source follower transistor 128 converts the stored charge at the floating diffusion region FD into an electrical output voltage signal. The row select transistor 130 is controllable by a row select signal SELECT for selectively connecting the source follower transistor 128 and its output voltage signal to a pixel output line 132.

The reference pixel $220_{REF}$ of the illustrated embodiment, however, differs from the typical reference pixel $120_{REF}$ in that the photosensor 122 of the illustrated embodiment is tied to the array pixel supply voltage Vaa-pix. That is, the photosensor 122 contains a contact (e.g., contact 214 illustrated in FIG. 9) connected to the array pixel supply voltage Vaa-pix. As such, in operation, the reference pixel $220_{REF}$ is depleted of electrons, and always appears electrically black/dark. In addition, during the operation of the reference pixels $220_{REF}$, any dark current electrons as well as any electrons generated by absorbed photons generated in the photosensor 122 (by e.g., the phenomena described above with respect to FIG. 5) are instantly swept away. Since the electrons are swept away, there can be no warm or hot reference pixels $220_{REF}$. Thus, only electrically black or dark reference pixels $220_{REF}$ are used in row-wise noise correction (as described in application Ser. No. 10/834,844), which cannot be adversely impacted by warm/hot pixel effects.

In FIG. 6, the illustrated photosensor 122 is a pinned photodiode. As such, the invention is described by way of example with use of a pinned photodiode photosensor 122. It should be noted that the invention is not limited to a pinned photodiode photosensor 122. The invention can be used with non-pinned photodiodes, photogates, photoconductors or other photosensitive elements.

Figure 7:
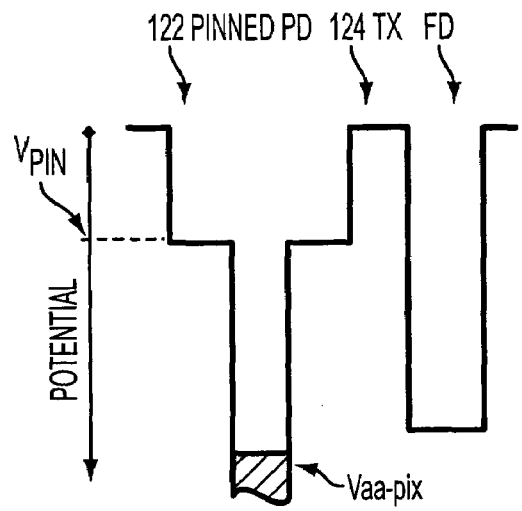
FIG. 7 illustrates an exemplary potential diagram for the exemplary pixel of FIG. 6.

FIG. 7 illustrates a potential diagram for the reference pixel $220_{REF}$ using a pinned photodiode photosensor 122. The pinned photodiode has a pinned voltage Vpin. The array pixel supply voltage Vaa-pix is also shown. Is should be appreciated that the photosensor 122 could be connected to any voltage and is not limited solely to the array pixel supply voltage Vaa-pix. For example, if the photosensor 122 is a pinned photodiode, the voltage connected to the photodiode could be any voltage greater than the pinning voltage Vpin, but less than or equal to the maximum operating voltage of the part. If the photosensor 122 was implemented as a non-pinned photodiode, then the voltage connected to the photosensor 122 must be greater than or equal to the reset level of the photodiode (i.e., not limited to the array pixel supply voltage Vaa-pix). For example purposes only, the following description of the illustrated embodiment of the invention is made with respect to reference pixel $220_{REF}$ comprising a pinned photodiode connected to the array pixel supply voltage Vaa-pix.

It is necessary to keep the array pixel supply voltage Vaa-pix (connected to the photosensor 122) from reaching the transfer transistor 124 to isolate the floating diffusion region FD from the Vaa-pix potential when the transfer transistor 124 is activated. Isolation prevents the floating diffusion region from being pulled to the array pixel supply voltage Vaa-pix and keeps the output of the reference pixel $220_{REF}$ electrically black/dark.

Figure 8:
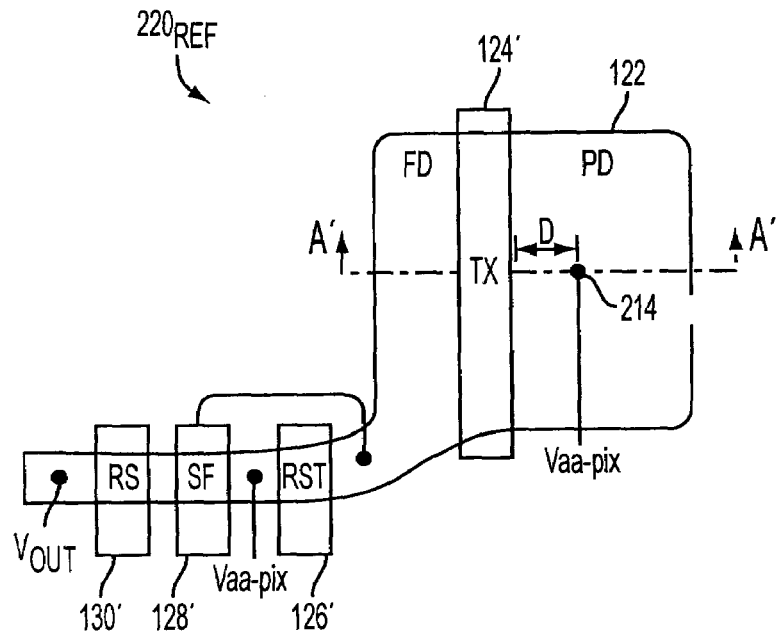
FIG. 8 illustrates an exemplary top down view of the exemplary pixel of FIG. 6.
Figure 9:
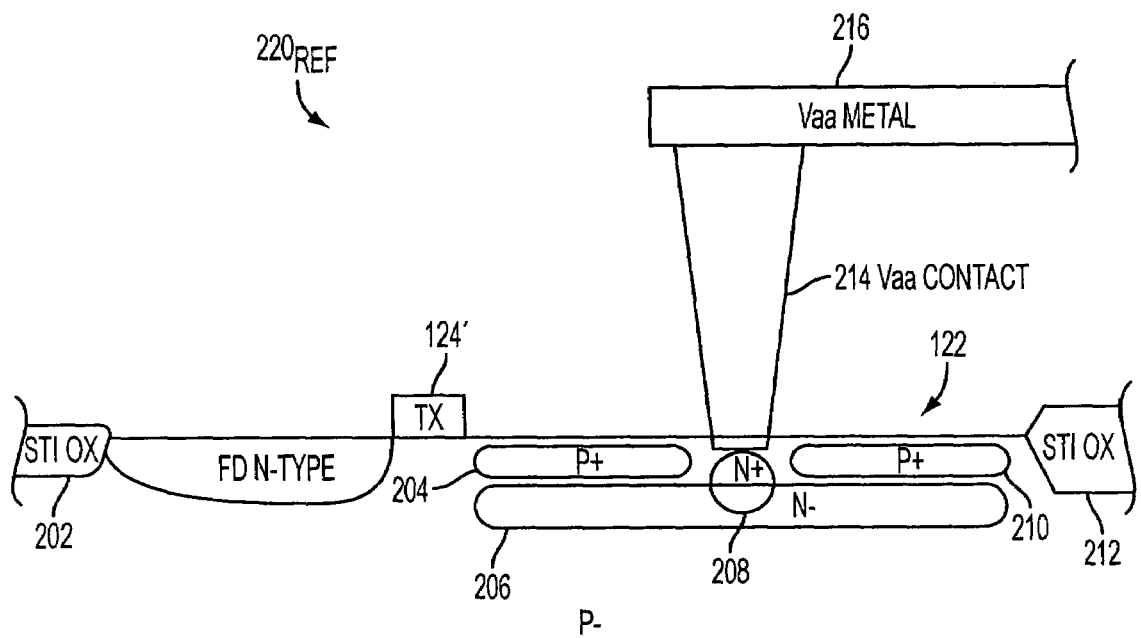
FIG. 9 illustrates an exemplary cross-sectional view of the exemplary pixel of FIG. 6.

Referring to FIGS. 8 and 9, the necessary isolation could be achieved by positioning the contact 214 connected to the array pixel supply voltage Vaa-pix a sufficient distance D from the transfer transistor gate 124'. It should be noted that the exact distance D from the transfer transistor gate 124' is dependent upon the implant conditions of the photosensor and the transfer transistor 124. FIG. 8 also shows the reset transistor gate 126', source follower gate 128' and the row select transistor gate 130'. In an alternative embodiment, a high threshold voltage transistor could be used as the transfer transistor 124. In the alternative embodiment, the threshold voltage of the transfer transistor 124 needs to be higher than the difference between the FD reset voltage and the array pixel supply voltage Vaa-pix (or the voltage that is connected to the photosensor 122 if Vaa-pix is not used).

FIG. 9 is a cross-sectional view of the reference pixel $220_{REF}$ taken along line A'-A' of FIG. 8, which illustrates one embodiment of connecting the array pixel supply voltage Vaa-pix to the photosensor 122 (implemented as a pinned photodiode). The pinned photodiode photosensor 122 contains an n– accumulation region 206 underneath two p+ surface regions 204, 210. A n+ implanted region 208 is also provided to make the best possible connection between the n– accumulation region 206 and the contact 214. The contact 214 is connected to a metal line 216, which is connected to the array pixel supply voltage Vaa-pix.

FIG. 9 also shows the transfer gate 124' connected between the photosensor 122 and the floating diffusion region FD (shown as an n-type region within a p– substrate). STI isolation regions 202, 212 are also shown, but any type of isolation technique can be used.

Figure 10:
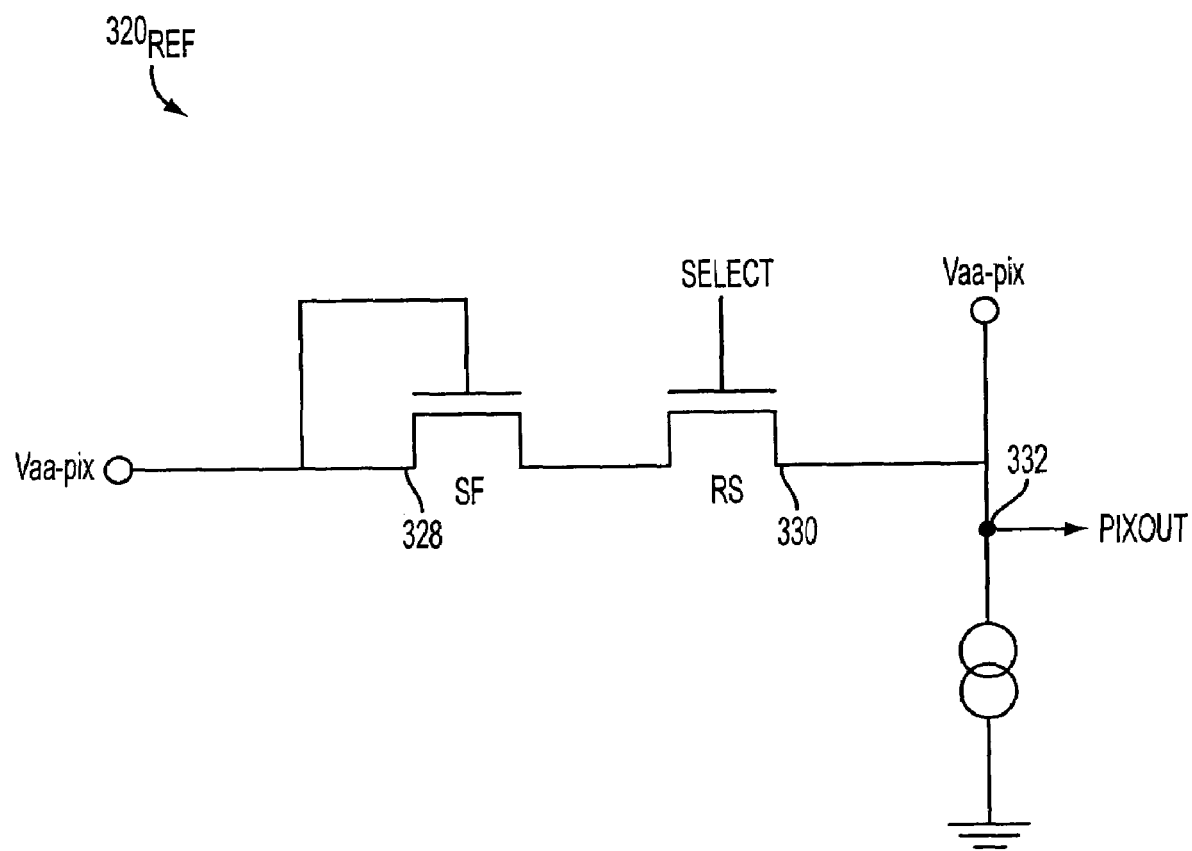
FIG. 10 illustrates another exemplary reference pixel, used in the FIG. 4 imager, constructed in accordance with another exemplary embodiment of the invention.

FIG. 10 illustrates a reference pixel $320_{REF}$ constructed in accordance with another embodiment of the invention. A plurality of the illustrated reference pixels $320_{REF}$ replace the plurality of reference pixels $120_{REF}$ in the imager 110 illustrated in FIG. 4. In the illustrated embodiment, the reference pixel $320_{REF}$ contains a source follower transistor 326 and a row select transistor 330, but does not contain a photosensor, transfer transistor or floating diffusion region. The source follower transistor 328 has its gate and one of its source/drain terminals connected to the array pixel supply voltage Vaa-pix. With this configuration, a voltage corresponding to the electrically dark condition is always output on the column line 332 when the row select transistor 330 is activated by the SELECT signal. The voltage on the source/drain terminal and gate of the source follower transistor 328 could be any voltage as long as the pixel reset signal Vrst and the pixel image signal Vsig are identical, resulting in an electrically dark condition.

The illustrated embodiment does not allow for correlated double sampling. As such, the reference pixel $320_{REF}$ will alleviate most row-wise noise, but not the noise attributable to correlated double sampling (if any).

Figure 11:
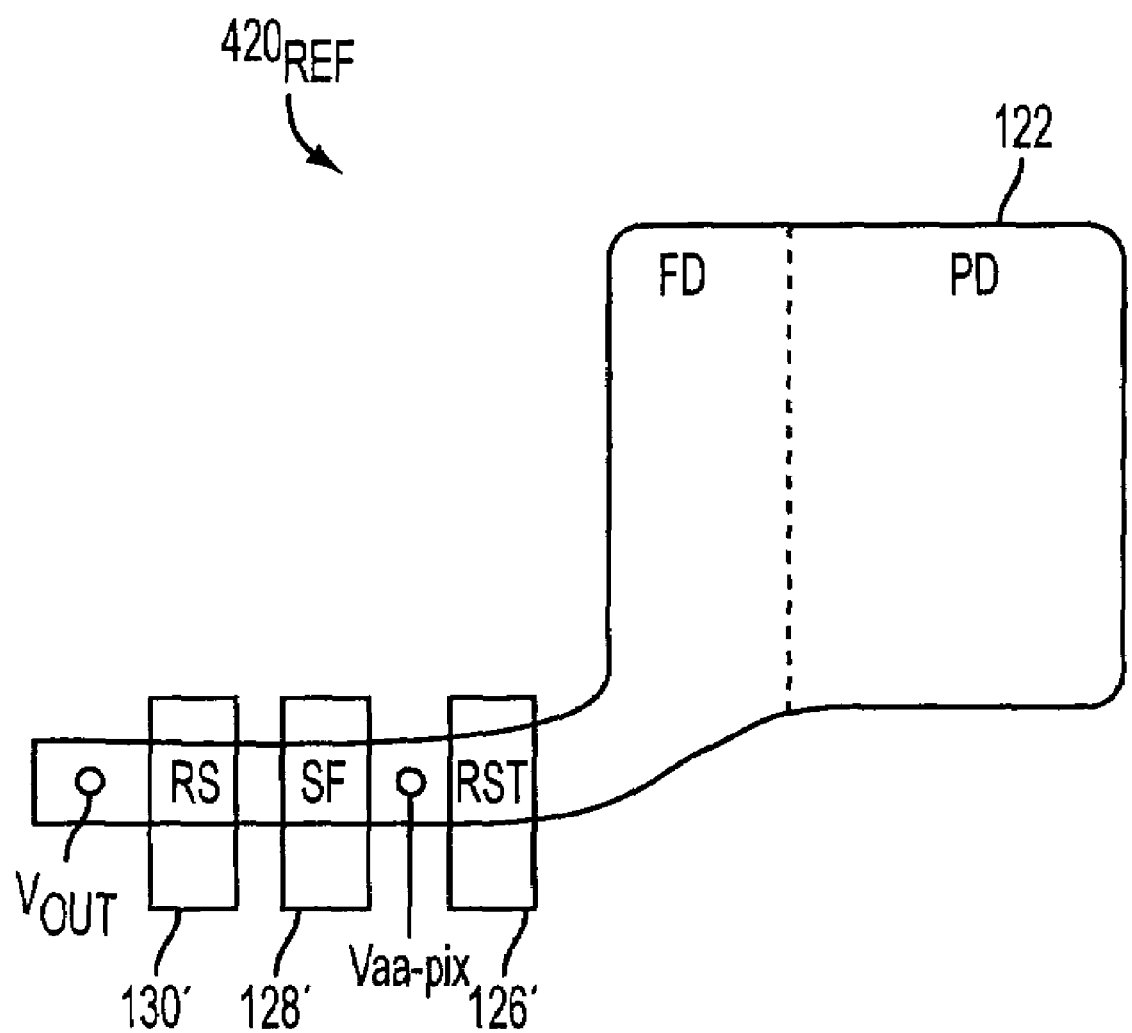
FIG. 11 illustrates another exemplary reference pixel, used in the FIG. 4 imager, constructed in accordance with another exemplary embodiment of the invention.

The above-illustrated embodiments may be modified to provide other means of "removing" the photosensor from the row-wise noise correction calculation. For example, it is possible to modify the reference pixel $220_{REF}$ by removing its transfer transistor 124, and not connecting the photosensor 122 to Vaa-pix, to form the reference pixel $420_{REF}$ illustrated in FIG. 11. A plurality of the illustrated reference pixels $420_{REF}$ replace the plurality of reference pixels $120_{REF}$ in the imager 110 illustrated in FIG. 4. During the operation of the illustrated reference pixel $420_{REF}$, a reset of the floating diffusion region FD will cause a reset of the photosensor 122 as well. This reset removes any electrons that could result in a warm or hot reference pixel $420_{REF}$.

In another modification, the typical reference pixel $120_{REF}$ is used, but operated in a manner that effectively removes the photosensor 22 (FIG. 5) from the row-wise noise correction calculations. In this alternative, both the transfer gate and reset gate are activated such that the photosensor is put into a reset state prior to readout. This alternative, as well as the alternative embodiment illustrated in FIG. 11, requires separate pixel control signals for the reference pixels $120_{REF}$ and the imaging pixels 120. In a desired embodiment of the FIG. 6 reference pixel $220_{REF}$, global pixel control signals can be used for each row since the reference pixel $220_{REF}$ and the imaging pixels 120 are operated in the same manner.

In another modification, the typical reference pixel $120_{REF}$ is used, but the n– accumulation region 206 implants from the photosensor 22 are removed or blocked from the reference pixel $120_{REF}$. This alternative physically removes the photosensor 22 from the equation thus preventing the formation of a warm or hot reference pixel.

In another alternative embodiment of the invention, the typical reference pixel $120_{REF}$ is used, but operated in another manner that effectively removes the photosensor 22 (FIG. 5) from the row-wise noise correction calculations. In this alternative, the transfer transistor 124 within the reference pixel $120_{REF}$ is never activated, which means that the charges from the photosensor 122 cannot be transferred to the floating diffusion region FD.

It should be appreciated that the placement of the reference pixels $220_{REF}$, $320_{REF}$, $420_{REF}$ could be on either or both sides of the pixel array 112 (FIG. 4).

Figure 12:
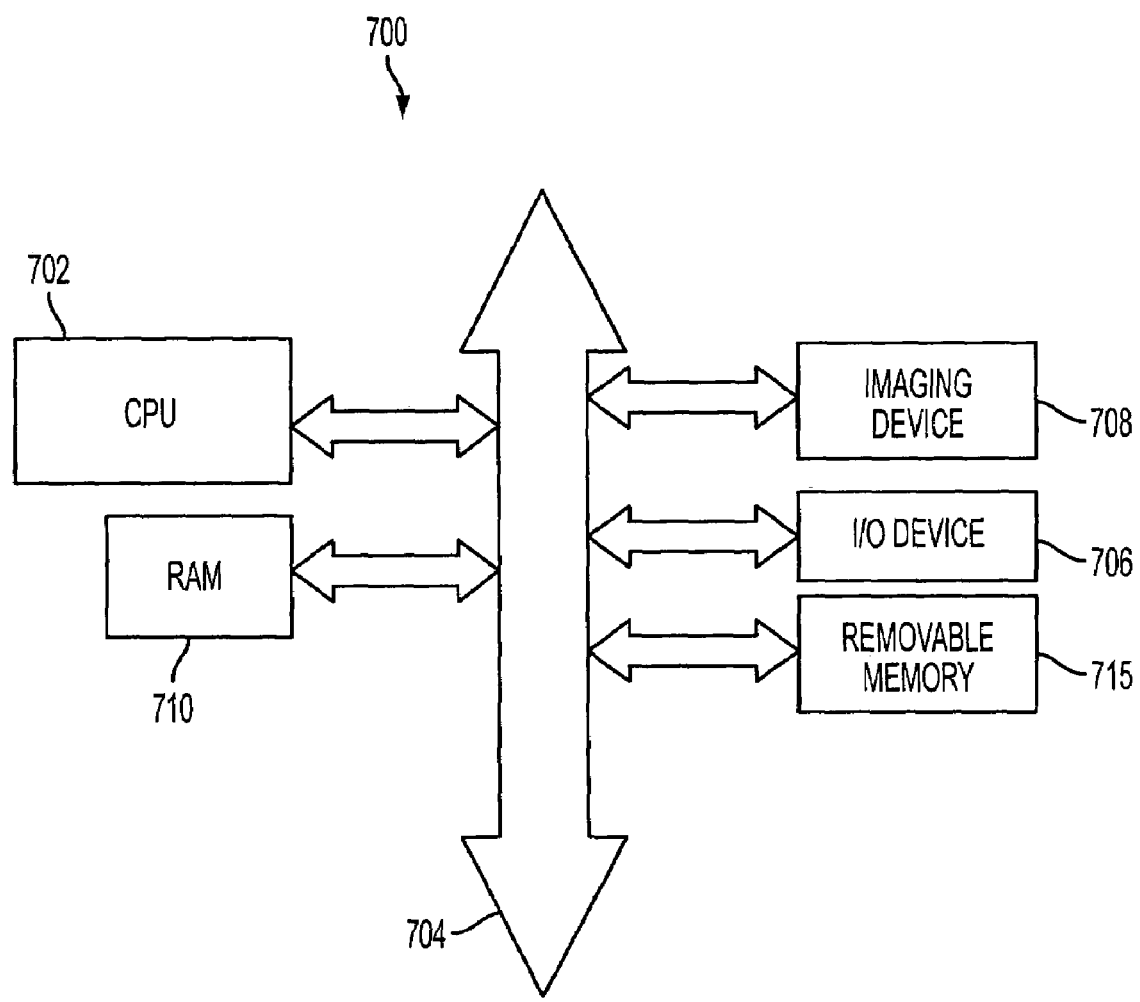
FIG. 12 shows a processor system incorporating at least one imaging device constructed in accordance with an embodiment of the invention.

FIG. 12 shows system 700, a typical processor system modified to include an imaging device 708 constructed in accordance with an embodiment of the invention (i.e., imager 110 of FIG. 4 having reference pixels of the invention e.g., reference pixels $220_{REF}$, $320_{REF}$, $420_{REF}$). The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 700, for example a camera system, generally comprises a central processing unit (CPU) 702, such as a microprocessor, that communicates with an input/output (I/O) device 706 over a bus 704. Imaging device 708 also communicates with the CPU 702 over the bus 704. The processor-based system 700 also includes random access memory (RAM) 710, and can include removable memory 715, such as flash memory, which also communicate with the CPU 702 over the bus 704. The imaging device 708 may be combined with a processor, such as a CPU, digital signal processor, or microprocessor, with or without memory storage on a single integrated circuit or on a different chip than the processor.

It should be appreciated that other embodiments of the invention include a method of manufacturing imaging devices 110 having reference pixels of the invention (e.g., reference pixels $220_{REF}$, $320_{REF}$, $420_{REF}$). For example, in one exemplary embodiment, a method of manufacturing an imaging device comprises the acts of fabricating an array of imaging pixels, said array being organized into a plurality of rows and columns, and fabricating a plurality of reference pixels, said plurality of reference pixels being arranged into a plurality of rows, each row of reference pixels corresponding to a respective row of imaging pixels within said array, each reference pixel being configured to output electrically black signals to be used in row-wise noise correction of signals from the imaging pixels from its associated row.

It should further be noted that the ability to reset the photosensor is not limited to the above-described embodiments. For example, another transistor may be directly connected to the photosensor of the reference pixels. When the additional transistor is activated, the photosensor will be reset by an appropriate voltage connected to a source/drain terminal of the additional transistor. Moreover, although the invention has been described as being part of a CMOS imager, it should be noted that the invention applies to any imager that uses row-wise noise correction based on dark or optically black reference pixels. That is, the invention also applies to CCD imagers.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An imaging device comprising:
   an array of imaging pixels, said array being organized into a plurality of rows and columns;
   a plurality of optically black pixels being arranged into a plurality of rows, said optically black pixels for generating optically black signals used for a black level pedestal; and
   a plurality of reference pixels, said plurality of reference pixels being arranged into a plurality of rows, each row of reference pixels corresponding to a respective row of imaging pixels within said array, each reference pixel including a circuit for causing said reference pixel to output electrically black signals to be used in row-wise noise correction of signals from the imaging pixels from its associated row, said reference pixels comprising a photosensor connected to a predetermined voltage for depleting any electrons from the photosensor.

2. The device of claim 1, wherein each reference pixel has a different configuration than the optically black pixels.

3. The device of claim 2, wherein the predetermined voltage is a supply voltage for said array.

4. The device of claim 2, wherein the photosensor is a pinned photodiode and the predetermined voltage has a potential greater than a pinning voltage of the pinned photodiode.

5. The device of claim 2, wherein the photosensor is a pinned photodiode and the predetermined voltage is a supply voltage for said array.

6. The device of claim 2, wherein the photosensor is a photodiode and the predetermined voltage has a potential greater than a reset potential of the photodiode.

7. The device of claim 1, wherein said imaging pixels and reference pixels are CMOS pixels.

8. The device of claim 1, wherein said imaging pixels and reference pixels are CCD pixels.

9. A processor system comprising:
   a processor; and
   an imaging device coupled to said processor, said device comprising:
   an array of imaging pixels, said array being organized into a plurality of rows and columns,
   a plurality of optically black pixels being arranged into a plurality of rows, said optically black pixels for generating optically black signals used for a black level pedestal; and
   a plurality of reference pixels, said plurality of reference pixels being arranged into a plurality of rows, each row of reference pixels corresponding to a respective row of imaging pixels within said array, each reference pixel including a circuit for causing said reference pixel to output electrically black signals to be used in row-wise noise correction of signals from the imaging pixels from its associated row, said reference pixels comprising a photosensor connected to a predetermined voltage for depleting any electrons from the photosensor.

10. The system of claim 9, wherein each reference pixel has a different configuration than the optically black pixels.

11. The system of claim 10, wherein the predetermined voltage is a supply voltage for said array.

12. The system of claim 10, wherein the photosensor is a pinned photodiode and the predetermined voltage has a potential greater than a pinning voltage of the pinned photodiode.

13. The system of claim 10, wherein the photosensor is a pinned photodiode and the predetermined voltage is a supply voltage for said array.

14. The system of claim 10, wherein the photo sensor is a photodiode and the predetermined voltage has a potential greater than a reset potential of the photodiode.

15. The system of claim 9, wherein said imaging device is a CMOS imager.

16. The system of claim 9, wherein said imaging pixels and reference pixels are CMOS pixels.

17. The system of claim 9, wherein said imaging device is a CCD imager.

18. A method of operating an imaging device to provide row-wise noise correction, said method comprising the acts of:
   generating optically black signals from a plurality of optically black pixels;
   generating electrically black signals from a plurality of reference pixels in a row by connecting a photosensor of each reference pixel to a predetermined voltage and depleting any electrons from the photosensor;
   inputting signals from a plurality of active pixels in the row;
   applying a dark level pedestal offset based on the optically black signals to the signals from the active pixels; and
   using the electrically black signals from the reference pixels to substantially eliminate a row-wise noise component from the signals from the active pixels.

19. The method of claim 18, wherein the predetermined voltage is a supply voltage for said active pixels.

20. The method of claim 18, wherein the photosensor is a pinned photodiode and the connecting act comprises connecting the pinned photodiode to a potential greater than a pinning voltage of the pinned photodiode.

21. The method of claim 18, wherein the photosensor is a pinned photodiode and the connecting act comprises connecting the pinned photodiode to a supply voltage for the active pixels.

22. The method of claim 18, wherein the photosensor is a photodiode and the connecting act comprises connecting the photodiode to a potential greater than a reset potential of the photodiode.

23. A method of manufacturing an imaging device comprising the acts of:

fabricating an array of imaging pixels, said array being organized into a plurality of rows and columns;

fabricating a plurality of optically black pixels being arranged into a plurality of rows, said optically black pixels for generating optically black signals used for a black level pedestal; and fabricating a plurality of reference pixels, said plurality of reference pixels being arranged into a plurality of rows, each row of reference pixels corresponding to a respective row of imaging pixels within said array, each reference pixel being configured to output electrically black signals to be used in row-wise noise correction of signals from the imaging pixels from its associated row, said reference pixels comprising a photosensor connected to a predetermined voltage for depleting any electrons from the photosensor.

24. The method of claim 23, wherein each reference pixel has a different configuration than the optically black pixels.

25. The method of claim 24, wherein the predetermined voltage terminal is a supply voltage terminal for said array.

26. The method of claim 24, wherein the photosensor is a pinned photodiode and the predetermined voltage terminal is a supply voltage terminal for said array.

* * * * *